US006401236B1

(12) United States Patent
Baggenstoss et al.

(10) Patent No.: US 6,401,236 B1
(45) Date of Patent: Jun. 4, 2002

(54) METHOD TO ELIMINATE SIDE LOBE PRINTING OF ATTENUATED PHASE SHIFT

(75) Inventors: William J. Baggenstoss; William A. Stanton, both of Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/285,696

(22) Filed: Apr. 5, 1999

(51) Int. Cl.[7] .............................................. G06F 17/50
(52) U.S. Cl. ................ 716/19; 716/21; 430/5
(58) Field of Search ............................. 716/19, 20, 21, 716/4; 430/5

(56) References Cited

U.S. PATENT DOCUMENTS

| | | | |
|---|---|---|---|
| 5,244,759 A | 9/1993 | Pierrat | 430/5 |
| 5,558,963 A * | 9/1996 | Tsudaka et al. | 430/22 |
| 5,582,939 A | 12/1996 | Pierrat | 430/5 |
| 5,591,550 A | 1/1997 | Choi et al. | 430/5 |
| 5,601,954 A | 2/1997 | Krivokapic et al. | 430/5 |
| 5,636,002 A | 6/1997 | Garofalo | 355/53 |
| 5,672,450 A | 9/1997 | Rolfson | 430/5 |
| 5,718,829 A | 2/1998 | Pierrat | 216/12 |
| 5,795,682 A | 8/1998 | Garza | 430/5 |
| 5,853,923 A | 12/1998 | Tzu | 430/5 |
| 5,856,049 A * | 1/1999 | Lee | 430/5 |
| 5,897,977 A * | 4/1999 | Carcia et al. | 430/5 |
| 5,916,711 A * | 6/1999 | Salik et al. | 430/5 |
| 6,067,375 A * | 5/2000 | Tsudaka | 382/144 |
| 6,077,310 A * | 6/2000 | Yamamoto et al. | 716/19 |
| 6,106,979 A * | 8/2000 | Pierrat | 430/5 |
| 6,214,497 B1 * | 4/2001 | Slanton | 430/5 |

OTHER PUBLICATIONS

Toth et al, "Partial Coherence Optimization for Printing Chain Contacts Using an Autenuted Phase–shifted Mask," IEEE, Sep. 1999, pp. 368–371.*

* cited by examiner

Primary Examiner—Vuthe Siek
(74) Attorney, Agent, or Firm—Dickstein Shapiro Morin & Oshinsky LLP

(57) ABSTRACT

A computer implemented method that uses a full integrated circuit (IC) chip design, to be printed by an attenuated phase shift mask, as an input parameter. Each feature environment within the input full IC chip design is individually simulated to determine how the features within the environment would be printed from the mask created according to the input design. The simulation of each environment also determines the extent and locations of unwanted side lobes that would also be printed from the mask. Once the side lobes are determined, auxiliary features are incorporated into the input design so that the auxiliary features will become transparent openings within a mask created in accordance with the modified input design. Each auxiliary feature opening is placed at a side lobe location and is designed to eliminate the side lobe by passing radiant energy that is 180 degrees out of phase with the radiant energy of the side lobe. Thus, each auxiliary feature serves as a side lobe inhibitor when incorporated into the mask. The modified input design undergoes a proximity correction to ensure that features of each environment print as originally desired. Once corrected, each environment is simulated again to verify that its features will print as originally desired and without side lobes. Once verified, the modified input design is used to create an attenuated phase shift mask that prints the desired features, but does not print side lobes.

52 Claims, 8 Drawing Sheets

METHOD TO ELIMINATE SIDE LOBE PRINTING OF ATTENUATED PHASE SHIFT

BACKGROUND OF THE INVENTION

1. Field of the Invention

The present invention relates to the field of photolithography used in fabricating semiconductor devices and, more particularly to a method of eliminating the side lobe printing of attenuated phase shift masks.

2. Description of the Related Art

In the manufacture of semiconductor wafers, photolithography is used to pattern various layers on a wafer. A layer of resist is deposited on the wafer and exposed using an exposure tool and a template such as a mask or reticle. During the exposure process a form of radiant energy such as ultraviolet light is directed through the reticle to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

An integral component of the photolithographic process is the reticle. The reticle includes the pattern corresponding to features (e.g., transistors or polygates) at a layer of the integrated circuit (IC) design. The reticle is typically a transparent glass plate coated with a patterned light blocking material such as, for example, chromium. This type of reticle is typically referred to as a binary mask since light is completely blocked by the light blocking material and fully transmitted through the transparent glass portions.

There are problems with the binary mask. Light passing through the edge of a pattern within the mask (e.g., the boundary between a light blocking region and a transparent region) is oftentimes diffracted. This means that instead of producing a very sharp image of the edge on the resist layer, some lower intensity light diffracts beyond the intended edge boundary and into the regions expected to remain dark. Hence, the resultant feature shapes and sizes deviate somewhat from the intended IC design. Since integrated circuit manufacturers have continued to reduce the geometric size of the IC features, this diffraction produces wafers with incomplete or erroneous circuit patterns.

Attenuated phase shift masks (PSMs) have been used to overcome the diffraction effects and to improve the resolution and depth of images projected onto a target (i.e., the resist covered wafer). Attenuated PSMs utilize partially transmissive regions instead of the light blocking regions used in binary masks. The partially transmissive regions typically pass through (i.e., do not block) about three to eight percent of the light they receive. Moreover, the partially transmissive regions are designed so that the light that they do pass is shifted by 180 degrees in comparison to the light passing through the transparent (e.g., transmissive) regions Thus, some of the light spreading outside of the transparent region defined by the PSM pattern edge destructively interferes with light passing from the partially transmissive regions. This way, the detrimental effects caused by diffraction may be controlled.

FIG. 1a illustrates a portion of a conventional attenuated phase shift mask 10. The mask 10 includes a transparent portion 12 that permits transmission of radiant energy, such as ultra violet light, and phase shifting or attenuating portions 14 that only permit transmission of about three to eight percent of the light they receive. Also, the attenuating portions 14 phase shift any light they pass by 180 degrees. The attenuating portions 14 contain a single pattern or opening corresponding to a desired IC feature and is referred to herein as feature opening 16 (since a feature of the IC design will be produced from this opening in the attenuating portions 14).

FIG. 1b is a graph 20 illustrating the electric field amplitude, with respect to distance, present at a wafer being processed with the conventional attenuated phase shift mask 10 of FIG. 1a. As shown in the graph 20, the electric field profile actually contains three components: the first component 22, which is in phase with the light passing through the feature opening 16, and the second and third components 24, 26, which are 180 degrees out of phase with the light passing through the feature opening 16.

FIG. 1c is a graph 30 illustrating the light intensity amplitude, with respect to distance, present at a wafer being processed with the mask 10 of FIG. 1a. As known in the art, intensity of the light passing through the attenuated phase shift mask 10 (FIG. 1a) is proportional to the electric field energy squared (i.e., I $E^2$). As shown, the intensity profile includes a first component 32 corresponding to the feature opening 16 (FIG. 1a). This first component 32 is desired since it corresponds to a feature of the IC design. However, the intensity profile also includes two other components 34, 36 which are not desired. These components 34, 36 are the combination (sum) of the diffraction of the 180 degrees phases of the components 24, 26 (FIG. 1b) and the approximate six percent background of the attenuating portions 14 of the mask 10 (FIG. 1a). These components are known in the art as side lobes and may corrupt the desired feature or cause undesired features to be etched into the wafer (known in the art as side lobe effects).

FIGS. 1a–1c illustrate a simple mask 10 with only one feature opening 16. As known in the art, the side lobe effects becomes more pronounced as the spacing between the IC features decreases. That is, when features are designed close to each other, which is the current trend, the electric field and intensity components associated with the side lobes of each feature begin to overlap and add-up. This causes side lobes of greater amplitude and increases the side lobe effect. Sometimes, the amplitude of these "additive" side lobes are greater than the amplitude of the desired features, which further corrupts the fabrication process.

There is a need to eliminate side lobes from being printed from an attenuated phase shift mask. In theory, the light forming a side lobe can be eliminated by light that is 180 degrees out of phase with the side lobe light. One attempt at eliminating the side lobes, has been to manually place additional transparent openings in the attenuated phase shift mask at locations where it is believed that side lobes may be printed. The additional openings would be sized and formed in the reticle so that they will pass the proper amount of out of phase light to cancel the side lobe. This manual process, however, is extremely time consuming. In addition, since the feature size has dramatically decreased, and the number of features within the IC design has greatly increased, it is not feasible, and virtually impossible, to manually eliminate all of the side lobes particularly for a very large scale IC. Thus, wafers may still be ruined with a manually altered mask.

Other methods have used design rule algorithms to place the additional openings at locations where the rules detect that side lobes would print. Rules take the form of "if the distance between two features is X then a side lobe would print at Y." Developing the design rules, however, is very time consuming. In addition, an IC design may incorporate numerous unique environments (e.g., different placements of the IC features) and thus, the resulting attenuated phase shift mask may be very complex. Moreover, the likelihood that a side lobe will form and where it will form is dependent upon the configuration and proximity of adjacent IC features. It would be very time consuming and practically impossible to develop rules to locate all of the potential side lobes (and their locations) for the many possible feature environments within a complex IC design. That is, this method could not handle the full IC chip design.

Accordingly, there is a need and desire for a method of eliminating side lobe printing from an attenuated phase shift mask that is less time consuming then other attempts to eliminate side lobe printing. Moreover, there is a need and desire for a method of eliminating side lobe printing from an attenuated phase shift mask based on a full integrated circuit (IC) chip design.

SUMMARY OF THE INVENTION

The present invention provides a method of eliminating side lobe printing from an attenuated phase shift mask that is less time consuming then other attempts to eliminate side lobe printing.

The present invention also provides a method of eliminating side lobe printing from an attenuated phase shift mask based on a full integrated circuit (IC) chip design.

The above and other features and advantages of the invention are achieved by a computer implemented method that uses a full integrated circuit (IC) chip design, to be printed by an attenuated phase shift mask, as an input parameter. Each feature environment within the input full IC chip design is individually simulated to determine how the features within the environment would be printed from the mask created according to the input design. The simulation of each environment also determines the extent and locations of unwanted side lobes that would also be printed from the mask. Once the side lobes are determined, auxiliary features are incorporated into the input design so that the auxiliary features will become transparent openings within a mask created in accordance with the modified input design. Each auxiliary feature opening is placed at a side lobe location and is designed to eliminate the side lobe by passing radiant energy that is 180 degrees out of phase with the radiant energy of the side lobe. Thus, each auxiliary feature serves as a side lobe inhibitor when incorporated into the mask. The modified input design undergoes a proximity correction to ensure that features of each environment print as originally desired. Once corrected, each environment is simulated again to verify that its features will print as originally desired and without side lobes. Once verified, the modified input design is used to create an attenuated phase shift mask that prints the desired features, but does not print side lobes. If not verified, the modified input design may be processed again to eliminate remaining side lobes.

BRIEF DESCRIPTION OF THE DRAWINGS

The foregoing and other advantages and features of the invention will become more apparent from the detailed description of the preferred embodiments of the invention given below with reference to the accompanying drawings in which:

FIGS. 1b and 1c illustrate electric field and light intensity amplitude vs. distance plots experienced at a wafer being processed with the conventional attenuated phase shift mask of FIG. 1a;

FIGS. 7b and 7c illustrate electric field and light intensity amplitude vs. distance plots experienced at a wafer being processed with the attenuated phase shift mask of FIG. 7a;

DETAILED DESCRIPTION OF PREFERRED EMBODIMENTS

Figure 2:
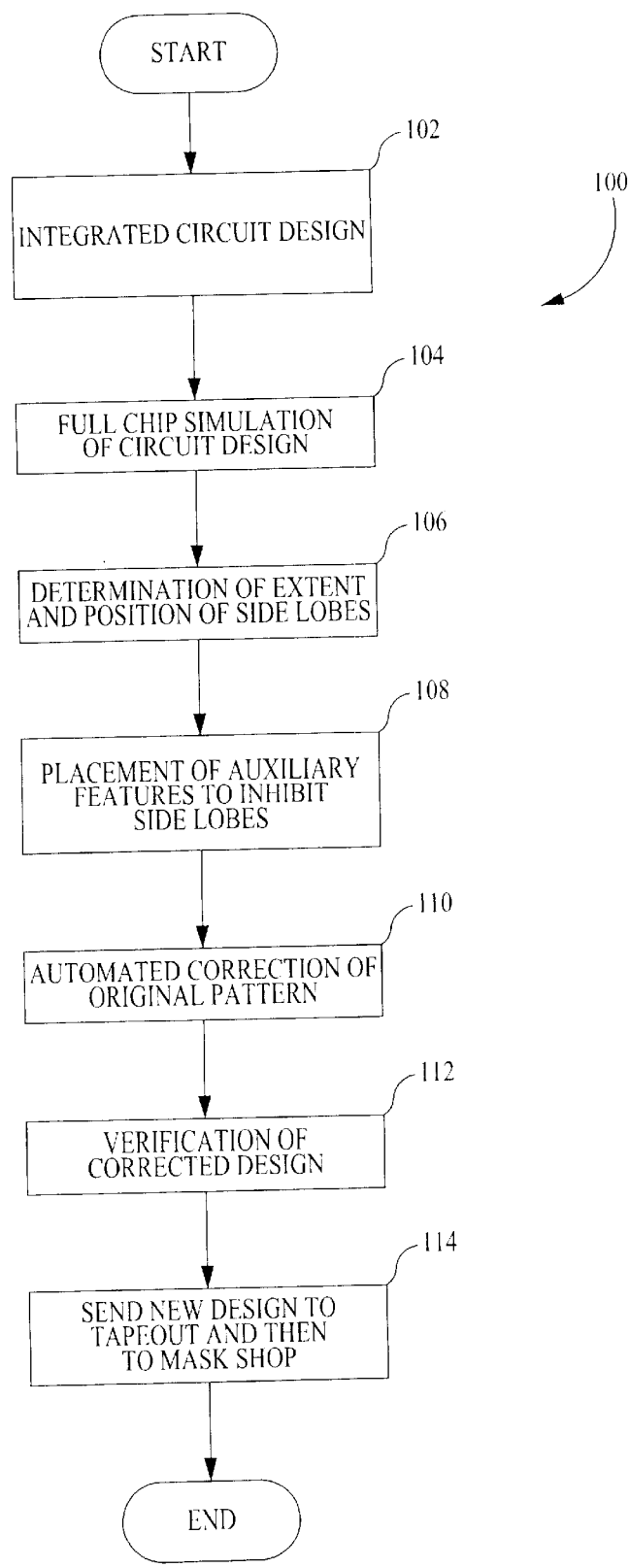
FIG. 2 illustrates an exemplary process for eliminating side lobe printing from attenuated phase shift masks in accordance with the present invention.

FIG. 2 illustrates an exemplary process 100 for eliminating side lobe printing from attenuated phase shift masks in accordance with the present invention. The process 100 is preferably implemented in software and executed on at least one computer system or workstation. As will become apparent, the process 100 can be executed on several computer systems or workstations to reduce the time required to execute the process 100.

Briefly, the process 100 will input a full IC chip design and simulate the various environments (i.e., placement of IC features, such as transistors) to see how the features within each environment will print from an attenuated phase shift mask created in accordance with the input design. The simulation of each environment also determines the extent and locations of unwanted side lobes that would also print based from the mask based on the input design. Once the side lobes are determined, the process 100 incorporates auxiliary features into the input design so that the auxiliary features will become transparent openings within a mask created in accordance with the modified input design. Each auxiliary feature opening is placed at a side lobe location and is designed to eliminate the side lobe by passing radiant energy that is 180 degrees out of phase with the radiant energy of the side lobe. Thus, each auxiliary feature serves as a side lobe inhibitor when incorporated as an opening into the mask. The process 100 then performs an optimal proximity correction on the modified input design (only on the desired IC features) to ensure that desired features of each environment print as originally desired. The process 100 then simulates each environment to verify that its features will print as originally desired and without side lobes. Once verified, the modified input design is used to create an attenuated phase shift mask that prints the desired features, but does not print side lobes. If not verified, the process 100 may be rerun to eliminates remaining side lobes.

At step 102, the process 100 inputs a full IC chip design. It is desirable for the design to be contained in the industry standard GDSII format, but it should be appreciated that any other suitable format could be used. The design does not have to be created on the same computer system or workstation that is executing the process 100. For example, the design could be created at a first computer workstation and then transferred to the computer executing the process 100 via a computer readable storage medium, network connection, electronic mail (e-mail), etc. The input IC design will contain one mask level and will typically contain polygons corresponding to the numerous feature configurations. That is, it will contain a single layer of features within the full IC design, which may contain several layers, that can be printed from one attenuated phase shift mask.

Figure 8:
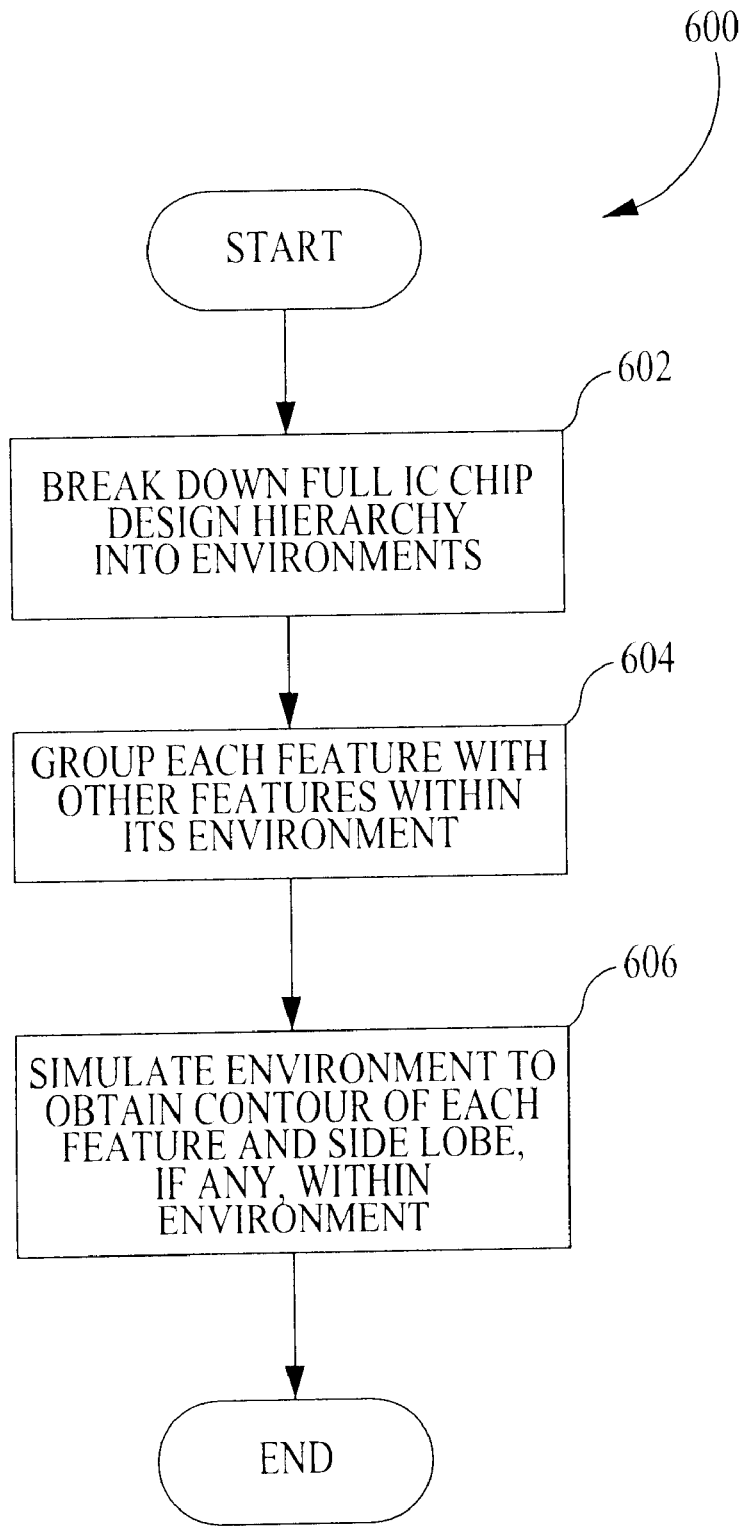
FIG. 8 illustrates an exemplary process for simulating an environment of an IC design to obtain a contour of the features and side lobes within the environment.

At step 104, the input full IC chip design is simulated to determine how the features in the design would print from a mask created in accordance with the design. Here, the hierarchy of the design is broken-up into different environments (i.e., placement of the features within the design) and then a model based simulation is performed on each environment to determine what a wafer being processed by a mask created in accordance with the input design would look like. That is, it is possible to simulate the printed contours of the features within each environment. These steps are performed using a conventional behavioral model based simulation tool, such as PROTEUS by AVANT!, that is modified to identify the different environments as shown in FIG. 8. Moreover, once the full IC chip design is broken down into individual environments, each environment can be distributed to another computer system or workstation executing the process 100 of the present invention and thus, multiple environments can be processed in parallel, which greatly increases the speed of the process 100. Alternatively, the process 100 can be initiated on several different computer systems or workstations using the same full IC chip design input, but once the different environments are detected at step 104, the user can select different environments for processing by each computer system (therefore, there would not be a need to transfer an environment to a different computer workstation).

Referring to FIG. 8, a description of an exemplary process 600 for simulating an environment of the IC design to obtain a contour of the features and side lobes within the environment now follows. Initially, the original input design hierarchy is modified based on the environment of each feature (step 602). Each feature is then grouped with the other cells of its environment (step 604). At step 606, the environment is simulated (as described below) to obtain a contour of the features within the environment. The contour represents what each feature within an environment would actually look like on the wafer being processed.

The model based simulation may be performed in many ways. A first way would be to use an optical model. An optical model uses the mathematics of image formation to produce the simulated contour pattern. Different parameters, such as the wavelength of light and numerical aperture, defocus, etc. can be set to match the settings of the exposure equipment used to process the wafer.

A second method would use a process model. The process model utilizes actual data from an exposed wafer, from either the resist pattern or the pattern after the wafer has been etched. This "real" data is used to create an empirical model which is adjusted so that the results of the simulation match the experimental data. This approach allows the software of the present invention to accurately predict the response of a given pattern without having a theoretical understanding of everything that takes place in transferring the mask pattern onto the wafer. It should be noted that the optical and process models will both be capable of generating contours for side lobes if they would be printed based on the input design and their respective simulations.

FIGS. 3a–3d illustrate exemplary simulation contour maps of four different environments 200, 220, 240, 260 created during step 104 of the process (FIG. 2). The first environment 200 contains squares 202 that represent features of the input IC design and circles 204 that represent the contours of the features represented by the squares 202. In addition, the first environment 200 contains other contours 206 which are not contained within a square or polygon. These other contours 206 represent unwanted side lobes that would print within the environment 200 from a mask based on the input IC design. All of the contours 204, 206 were obtained from one of the simulation models as described above with reference to FIG. 2. It is desirable, for the present invention to eliminate the side lobe contours 206 yet keep the contours 204 of the IC features 202.

Similarly, the second environment 220 contains squares 222 that represent features of the input IC design and circles 224 that represent the contours of the features represented by the squares 222. In addition, the second environment 220 contains other contours 226 which are not contained within a square or polygon. These other contours 226 represent unwanted side lobes that would print within the environment 220 from a mask based on the input IC design. The third environment 240 contains squares 242 that represent features of the input IC design and circles 244 that represent the contours of the features represented by the squares 242. In addition, the third environment 240 contains other contours 246 which are not contained within a square or polygon. These other contours 246 represent unwanted side lobes. Likewise, the fourth environment 260 contains squares 262 that represent features of the input IC design and circles 264 that represent the contours of the features represented by the squares 262. In addition, the fourth environment 260 contains other contours 266 which are not contained within a square or polygon. These other contours 266 represent unwanted side lobes.

All of the feature contours 204, 224, 244,264 and side lobe contours 206, 226, 246, 266 within the four environments 200, 220,240, 260 were obtained from one of the simulation models described above with reference to FIG. 2 (step 104). It is desirable, for the present invention to eliminate the side lobe contours 206, 226, 246, 266 yet keep the feature contours 204, 224, 244, 264 of each environment. It should be noted that the side lobe contours 206,226, 246,266 of each environment 200, 220, 240, 260 differ from each other since the features of 202, 222, 242,262 of each environment 200, 220,240, 260 are placed differently. These are but a few of the many possible feature environments that could be incorporated into a single full IC chip design and a further example as to why the manual and rules based algorithm methods would be inefficient to eliminate side lobes completely. Moreover, these methods do not break down the IC chip design into environments, making it more difficult to detect and eliminate side lobes.

Figure 3A:
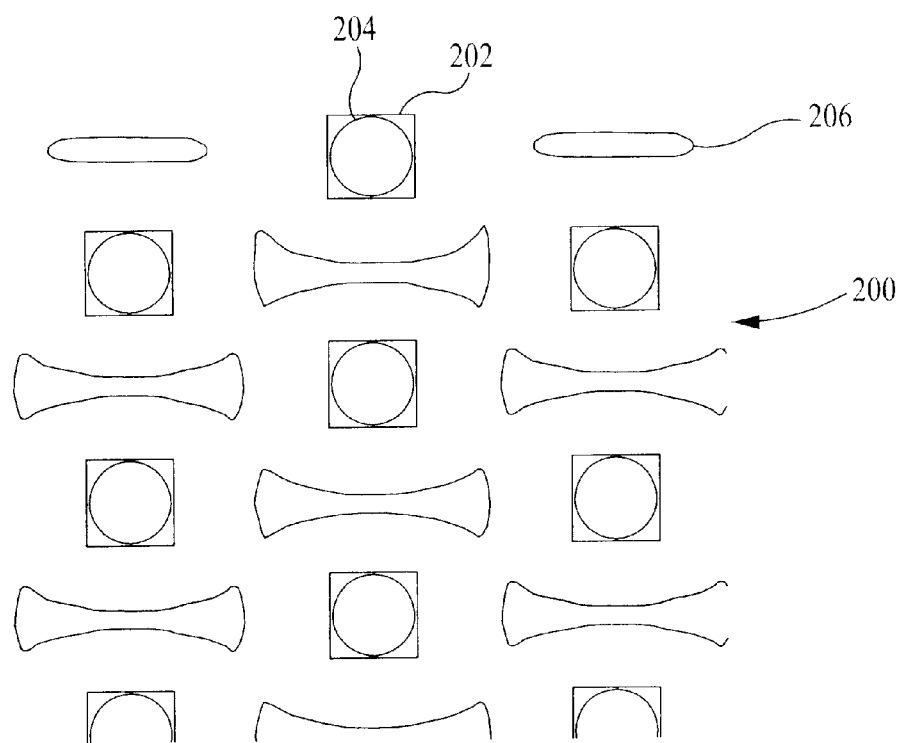
FIGS. 3a–3d illustrate exemplary simulation contour maps of different environments within an integrated (IC) design created within the process illustrated in FIG. 2.
Figure 3B:
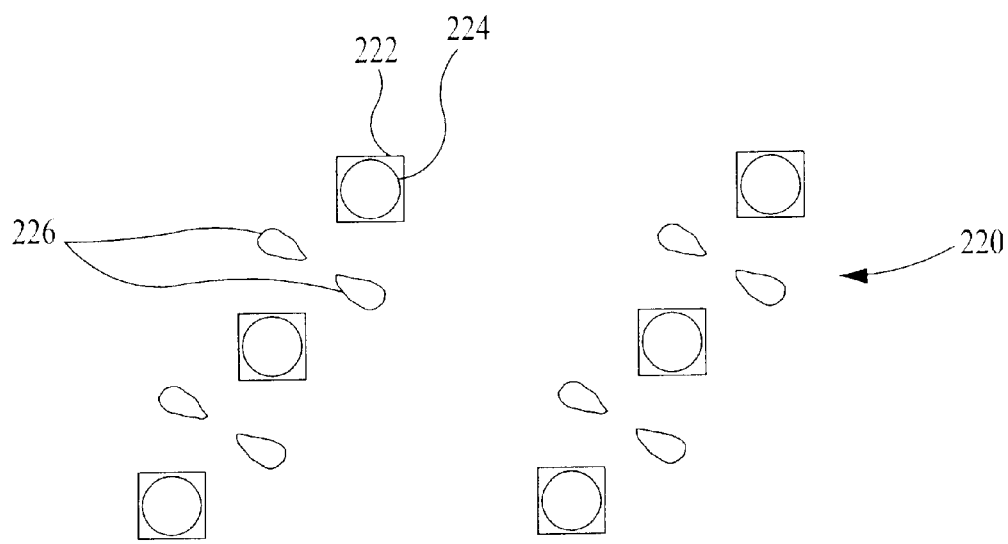
Figure 3C:
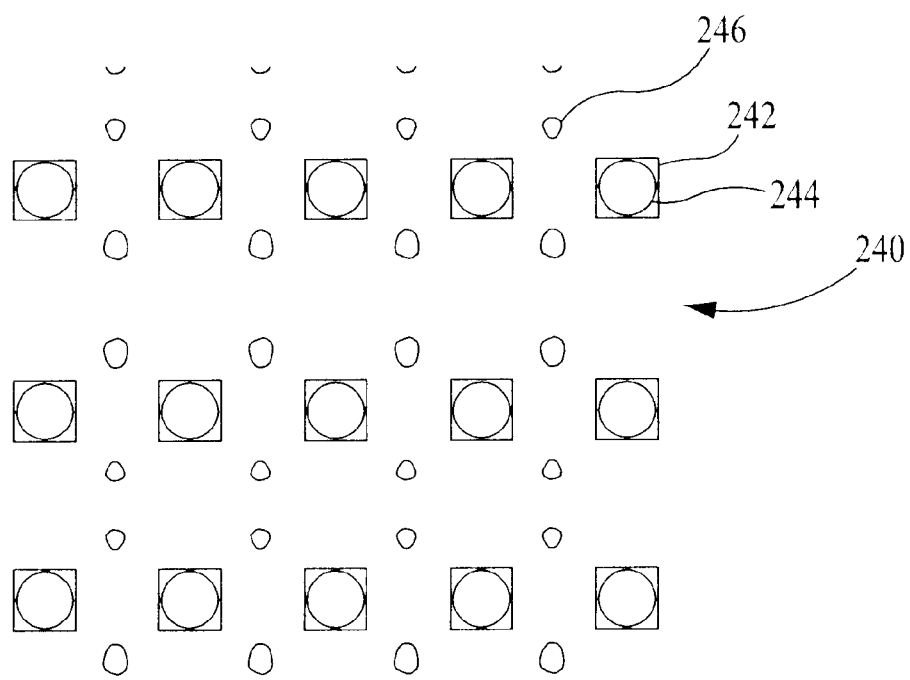
Figure 3D:
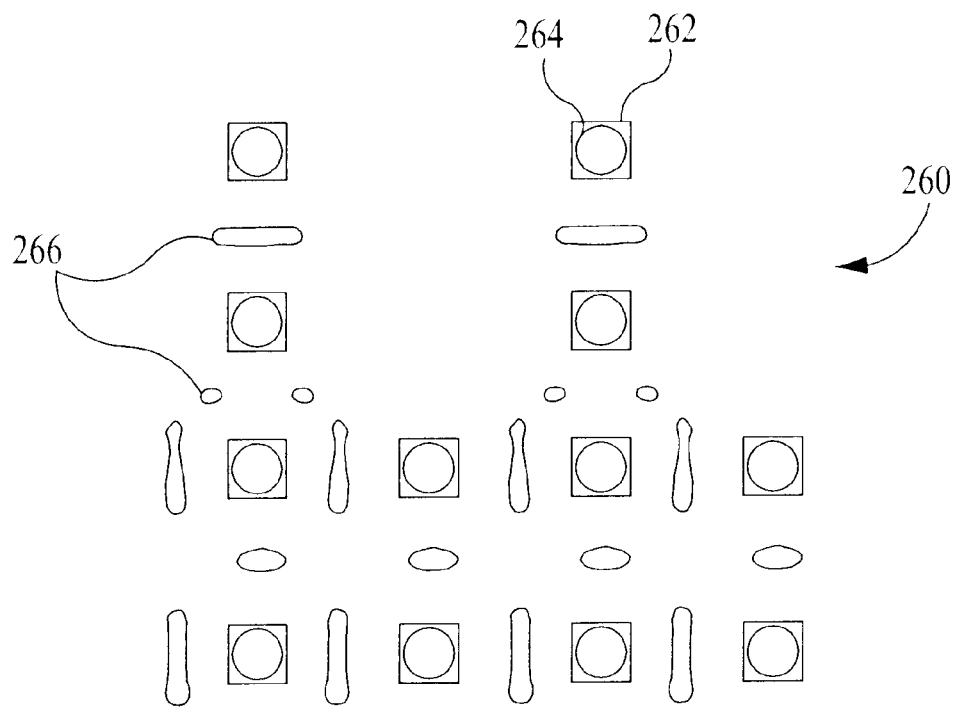

Referring to FIGS. 2 and 3c, the process 100 continues at step 106 to determine the extent and location of any side lobes within the environments. For convenience purposes only, the remaining description will illustrate how the process 100 eliminates side lobes from printing within the third environment 240. As noted above, the other environments 200, 220, 260 (FIGS. 3a, 3b and 3d) could be processed in parallel on other computer workstations if desired. At step 106, the extent and location of side lobes within the third environment 240 is determined. To determine the extent and location of the side lobes, the behavioral based simulation tool is modified to detect any contours 246 that occur outside of the feature squares 242. These contours 246 are marked as side lobes, their extent and location are recorded.

Figure 4:
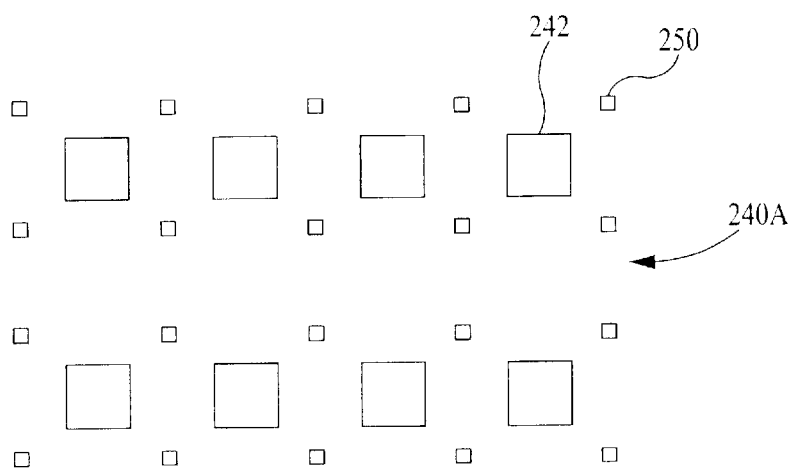
FIG. 4 illustrates an exemplary map of an environment that has been modified to include side lobe inhibitors according to the process illustrated in FIG. 2.

Referring to FIGS. 2 and 4, the process 100 places auxiliary features 250 within the third environment at locations corresponding to the side lobe contours 246 illustrated in FIG. 3c to form a modified third environment 240a. The features 250 are inserted into the input design and thus, form a modified input design. These auxiliary features 250 are sized and placed so that they will form transparent auxiliary feature openings within a mask created based on the modified third environment 240a. Since side lobes are created from light passing through the partially transmissive portions of the mask, the auxiliary feature openings will be transparent openings within the mask so that they will pass radiant energy (e.g., ultraviolet light) that is 180 degrees out of phase with the radiant energy of the side lobe and thus, cancel out the side lobe. Therefore, each auxiliary feature 250 serves as a side lobe inhibitor when incorporated into the attenuated phase shift mask incorporating the modified third environment 240a.

Figure 5:
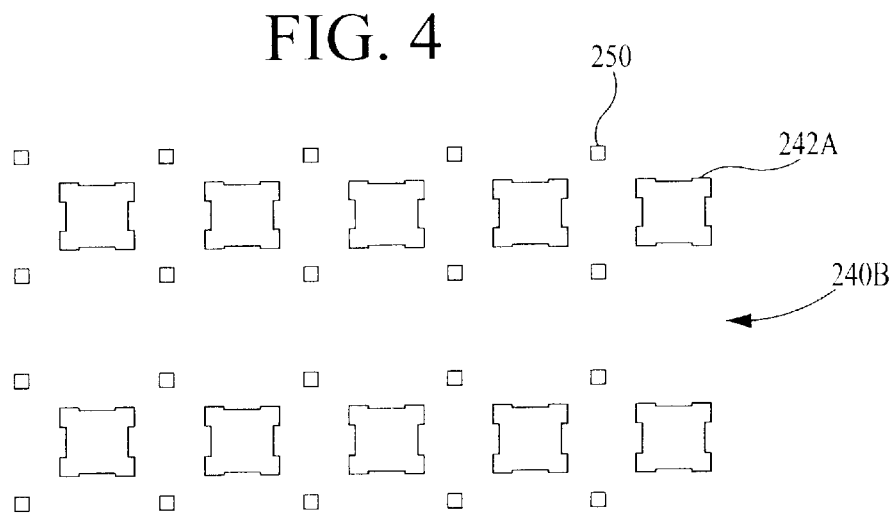
FIG. 5 illustrates an exemplary map of an environment containing side lobe inhibitors in which desired IC features have undergone optimal proximity correction (OPC) in accordance with the process illustrated in FIG. 2.

After step 108, the process 100 has created a modified third environment 240a that should print without side lobes. However, the process 100 has altered the original input design of the third environment 240 (FIG. 3c) and may have also altered the printing (i.e., contours) of the IC features. Thus, the process 100 must ensure that the IC features print as originally desired. Referring to FIGS. 2 and 5, the process 100 performs an automated correction based on the original input design (step 110). The automated correction is performed by an optimal proximity correction (OPC) method on the modified third environment (via the modified input design) to form a corrected third environment 240b. To perform the OPC, one of the simulation models described above with reference to step 104 is used to obtain the desired feature contours 244 (as illustrated in FIG. 3c) by modifying the feature squares 242 (FIG. 3c) until the desired contours 244 of each feature is obtained. It must be noted that the side lobe inhibitors do not undergo OPC. As illustrated in FIG. 5, the corrected third environment 340b now contains feature polygons 242a (as opposed to the squares 242 illustrated in FIG. 3c) and auxiliary features 250. The feature polygons 242a are inserted into the input design and thus, form a corrected modified input design. At this point, an attenuated phase shift mask implementing the corrected third environment 240b (via the corrected modified input design) should print the IC features as originally designed, but most importantly, should not print any side lobes. To be sure, however, the corrected third environment 240b is verified.

Figure 6:
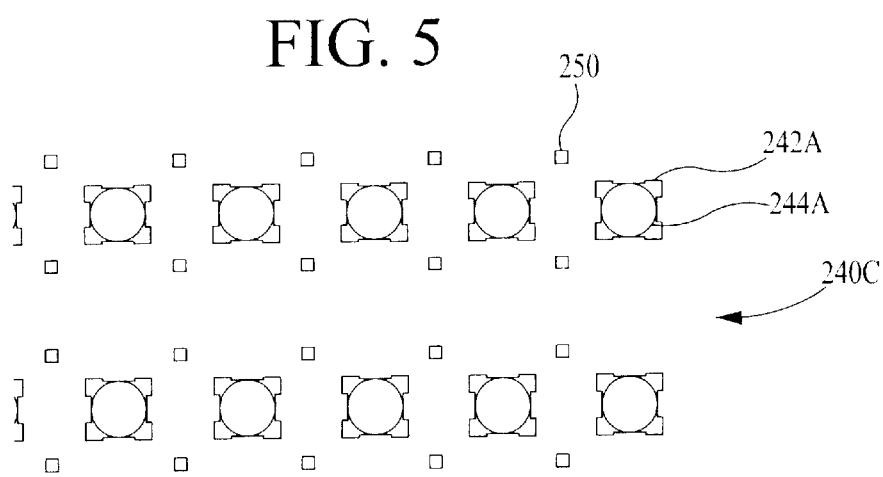
FIG. 6 illustrates a verified contour map of an environment containing side lobe inhibitors according to the process illustrated in FIG. 2.

Referring to FIGS. 2 and 6, the process 100 verifies the corrected third environment by simulating the environment (as performed above with reference to step 104) to form a verified third environment 240c (step 112). As shown in FIG. 5, the verified third environment 240c only contains contours 244a within the corrected feature polygons 242a. The contours 244a have the same shape and size as the contours 244 (FIG. 3c) of the original input design. Thus, the features of the original input design will be printed by an attenuated phase shift mask implementing the verified corrected design of the third environment 240c (via the corrected modified input design). No side lobe contours are illustrated in the verified third environment 240c. Thus, the side lobe contours 246 (FIG. 3c) that would have printed had the process 100 of the present invention not been executed, have been eliminated. If, however, it is determined at step 112 that side lobes would print, the process 100 could continue at step 108 so that more auxiliary features could be incorporated into the design (and steps 108–112 would be repeated).

At step 114, after all of the environments contained within the original full IC chip design have been simulated, modified, corrected and verified (steps 104–112), the modified input full IC chip design is sent to a tapeout (i.e., formatted so that a mask writing tool can input the design) and then sent to a mask shop, where an attenuated phase shift mask will be created that implements the side lobe free IC chip design.

Figure 7A:
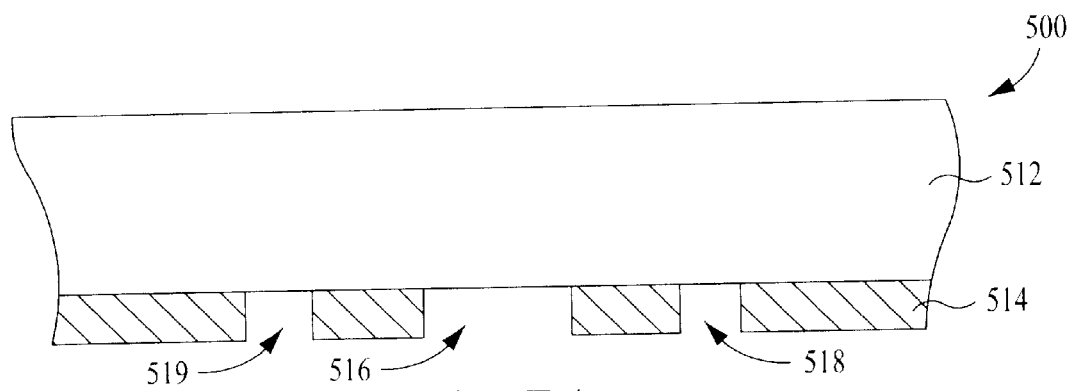
FIG. 7a illustrates a portion of an attenuated phase shift mask constructed in accordance with the process illustrated in FIG. 2.

FIG. 7a illustrates a portion of an attenuated phase shift mask 500 constructed in accordance with the process of the present invention. The mask 500 includes a transparent portion 512 and attenuating portions 514. The attenuating portions 514 contain a single feature opening 516 corresponding to a feature of the IC design and two auxiliary feature openings 518, 519 that serve as side lobe inhibitors since they will pass light that cancels the light passed by the attenuating portions 514 and thus, eliminate side lobes. This is apparent from the graphs 520, 530 of FIGS. 7b and 7c.

Figure 1A:
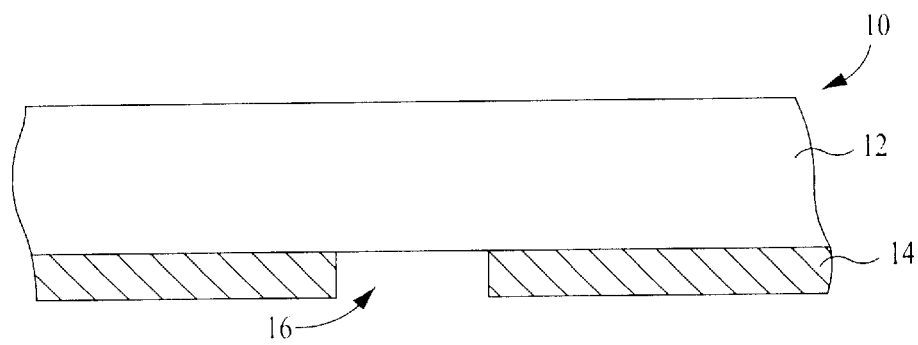
FIG. 1a illustrates a portion of a conventional attenuated phase shift mask.
Figure 1B:
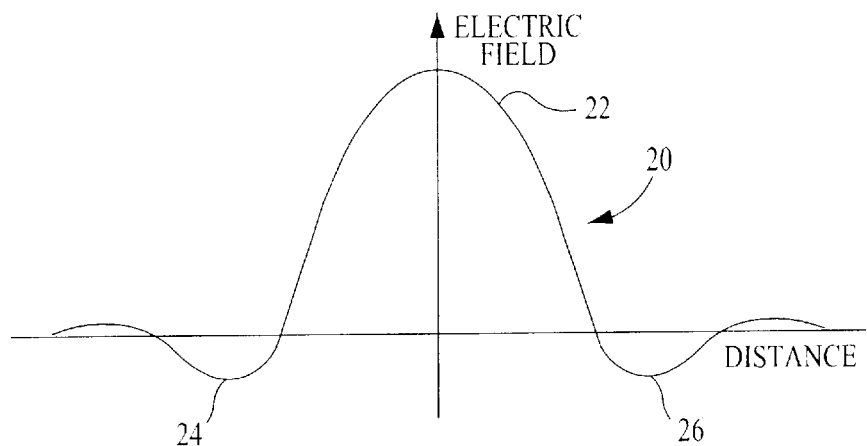
Figure 7B:
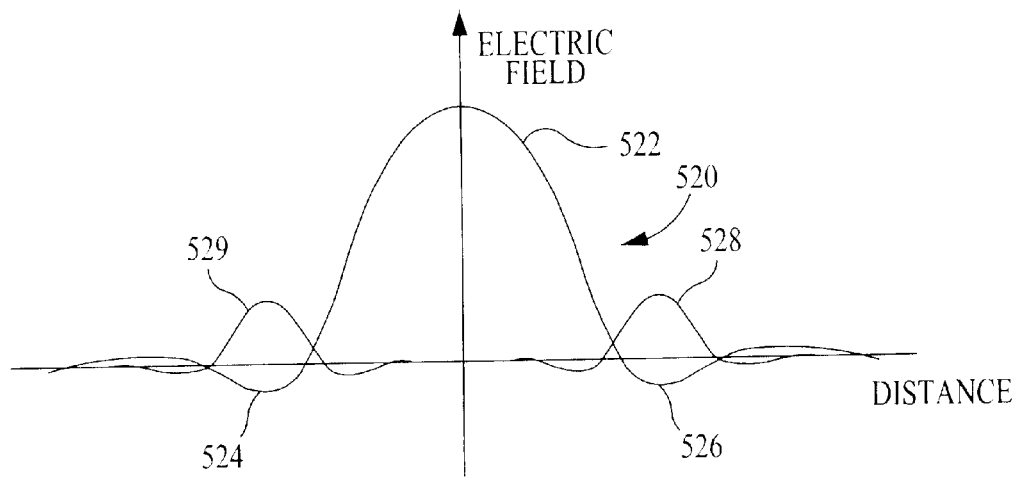

FIG. 7b is a graph 520 illustrating the electric field amplitude, with respect to distance, present at a wafer being processed with the attenuated phase shift mask 510 (FIG. 1a) constructed in accordance with the present invention. As shown in the graph 520, the electric field profile actually contains five components: the first component 522, which is in phase with the light passing through the feature opening 516, the second and third components 524, 526, which are 180 degrees out of phase with the light passing through the feature opening 516 and the fourth and fifth components 528, 529, which are in phase with the light passing through the auxiliary feature opening 518, 519, but also 180 degrees out of phase with the light passing through the attenuating portions 514.

Figure 1C:
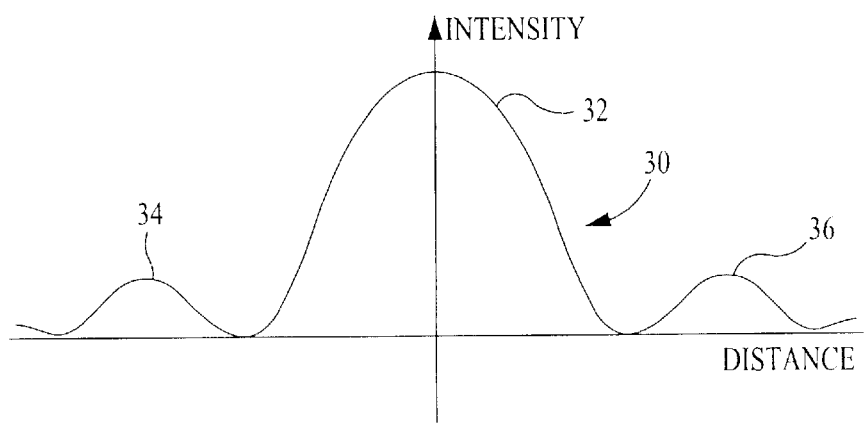
Figure 7C:
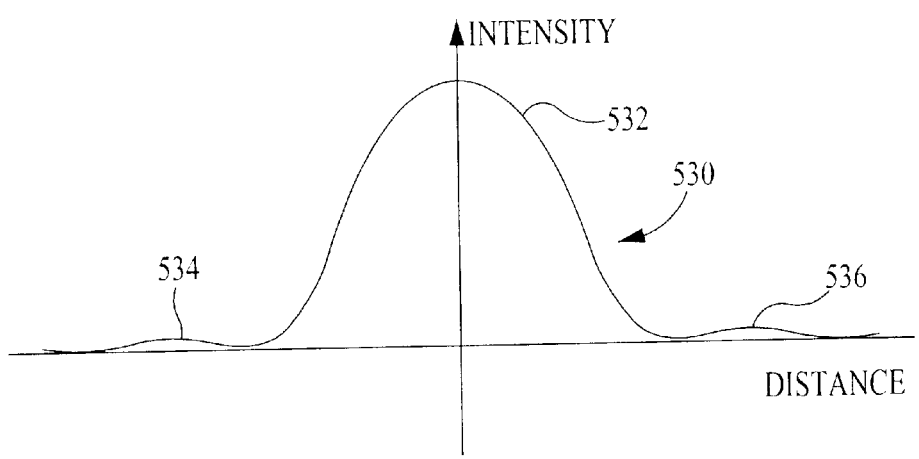

FIG. 7c is a graph 530 illustrating the light intensity amplitude, with respect to distance, present at a wafer being processed with the mask 510 (FIG. 7a) constructed in accordance with the present invention. As shown, the intensity profile includes a first component 532 corresponding to the feature opening 516 (FIG. 7a) that is desired. This first component 532 is desired since it corresponds to a feature of the IC design. The intensity profile illustrated also includes two other components 534, 536. Unlike the intensity profile of the conventional attenuating phase shift mask 10 (FIGS. 1a and 1c), however, these components 534, 536 are extremely insubstantial and would not lead to a side lobe. Thus, the mask created in accordance with the present invention, does not print side lobes.

Figure 9:
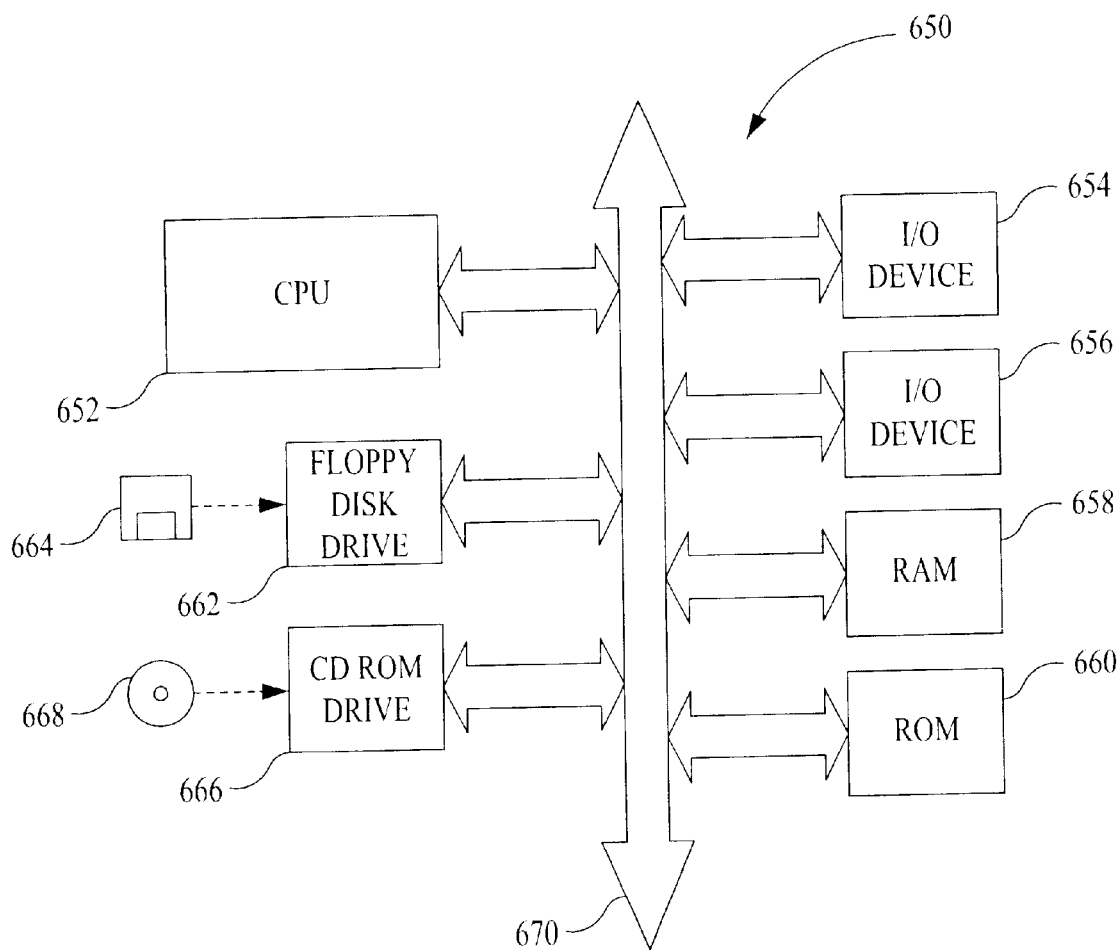
FIG. 9 illustrates an exemplary computer system in which the process of FIG. 2 may be implemented.

FIG. 9 illustrates an exemplary computer system 650 in which the process 100 of FIG. 2 may be implemented. The system 650 includes a central processing unit (CPU) 652 that communicates with an input/output (I/O) device 654 over a bus 670. A second I/O device 656 is illustrated, but not necessary to practice the present invention. The computer system 650 also includes random access memory (RAM) 658, read only memory (ROM) 660 and may include peripheral devices such as a floppy disk drive 664 or a compact disk read only memory (CD-ROM) drive 666 that also communicate with the CPU 652 over the bus 670. It must be noted that the exact architecture of the computer system 650 is not important and that any combination of computer compatible devices may be incorporated into the system 650 as long as the process of the present invention can be executed. In a preferred embodiment, the computer system 650 is a UNIX based workstation. Moreover, the program implementing the process of the present invention may be stored in ROM 608, a CD-ROM 668, floppy disk 664, hard disk drive or any other medium capable of storing a computer program and data required by the program. In addition, the computer program embodying the process of the present invention may be downloaded, for example, from a server computer or another computer connected to the computer system 650. As stated earlier, the process of the present invention can be executed in a distributed manner over several computer systems 650, whether connected by a network or not, to process different environments of the full IC chip design in a parallel fashion.

Thus, the present invention is capable of eliminating side lobe printing from an attenuated phase shift mask. By organizing the IC design into environments, the present invention can handle a very large full IC chip design quickly and accurately unlike prior side lobe elimination methods. Moreover, by operating on different environments of the IC design, the present invention can distribute environments to other computer systems so that the environments can be processed in a parallel manner.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A computer implemented method of eliminating side lobe printing from a phase shift mask implementing a circuit design, comprising the steps of:
   inputting the circuit design, the design comprising circuit features to be printed from the mask;
   organizing the input design into a plurality of feature environments;
   simulating the environments to determine contours of the environments;
   determining from the contours if there are any side lobes within the environments by determining whether a contour is associated with a circuit feature of the input design, and if a contour is not associated with a circuit feature, identifying the contour as a side lobe;
   placing an auxiliary feature within the environments at a location of each determined side lobe; and
   correcting each environment to form a corrected design and to ensure that circuit features of the corrected design print in accordance with the input circuit design, wherein the auxiliary features eliminate side lobe printing from the mask.

2. The method of claim 1 wherein said simulating step is performed by determining how the environments would print from the mask based on a simulation model.

3. The method of claim 2 wherein the simulation model comprises an optical model.

4. The method of claim 3 wherein the optical model utilizes image data determined by settings of a tool used to process a wafer with the mask to simulate the contours of the environments.

5. The method of claim 2 wherein the simulation model comprises a process model.

6. The method of claim 5 wherein the process model utilizes contour data from a processed wafer to simulate the contours of the environments.

7. The method of claim 1 wherein the circuit features correspond to transparent regions within the mask.

8. The method of claim 1 wherein said correcting step comprises an optimal proximity correction of the circuit features based on the placement of the circuit features and the auxiliary features within the environments.

9. The method of claim 1 wherein multiple environments of the input design are processed in a parallel manner.

10. A computer implemented method of eliminating side lobe printing from a phase shift mask implementing a circuit design, comprising the steps of:
    inputting the circuit design, the design comprising circuit features to be printed from the mask;
    organizing the input design into a plurality of feature environments;
    simulating the environments to determine contours of the environments;
    determining from the contours if there are any side lobes within the environments;
    placing an auxiliary feature within the environments at a location of each determined side lobe, wherein the auxiliary features correspond to transparent regions within the mask; and
    correcting each environment to form a corrected design and to ensure that circuit features of the corrected design print in accordance with the input circuit design, wherein the auxiliary features eliminate side lobe printing from the mask,
    wherein the mask also contains attenuating regions and wherein the transparent regions associated with the auxiliary features are designed to pass radiant energy that is 180 degrees out of phase with radiant energy passing through the attenuating regions.

11. A computer implemented method of eliminating side lobe printing from a phase shift mask implementing a circuit design, comprising the steps of:
    inputting the circuit design, the design comprising circuit features to be printed from the mask;
    organizing the input design into a plurality of feature environments;
    simulating the environments to determine contours of the environments;
    determining from the contours if there are any side lobes within the environments;
    placing an auxiliary feature within the environments at a location of each determined side lobe;
    correcting each environment to form a corrected design and to ensure that circuit features of the corrected design print in accordance with the input circuit design, wherein the auxiliary features eliminate side lobe printing from the mask; and
    verifying the corrected design to ensure that side lobes do not print from the mask by:
       simulating environments of the corrected design to determine contours of the environments; and
       determining from the contours if there are any side lobes within the corrected design.

12. The method of claim 11 wherein said step of simulating the corrected design is performed by determining how the environments of the corrected design would print from the mask based on a simulation model.

13. The method of claim 12 wherein the simulation model comprises an optical model.

14. The method of claim 13 wherein the optical model utilizes image data determined by settings of a tool used to process a wafer with the mask to simulate the contours of the environments of the corrected design.

15. The method of claim 12 wherein the simulation model comprises a process model.

16. The method of claim 15 wherein the process model utilizes contour data from a processed wafer to simulate the contours of the environments of the corrected design.

17. A computer readable storage medium containing a computer readable code for operating a computer to perform a method of eliminating side lobe printing from a phase shift mask implementing a circuit design, said method comprising the steps of:

inputting the circuit design, the design comprising circuit features to be printed from the mask;

organizing the input design into a plurality of feature environments;

simulating the environments to determine contours of the environments;

determining whether a contour is associated with a circuit feature of the input design, and if a contour is not associated with a circuit feature, identifying the contour as a determined side lobe;

placing an auxiliary feature within the environments at a location of each determined side lobe; and correcting each environment to form a corrected design and to ensure that circuit features of the corrected design print in accordance with the input circuit design, wherein the auxiliary features eliminate side lobe printing from the mask.

18. The computer readable storage medium of claim 17 wherein said method performs said simulating step by determining how the environments would print from the mask based on a simulation model.

19. The computer readable storage medium of claim 18 wherein the simulation model comprises an optical model.

20. The computer readable storage medium of claim 19 wherein the optical model utilizes image data determined by settings of a tool used to process a wafer with the mask to simulate the contours of the environments.

21. The computer readable storage medium of claim 18 wherein the simulation model comprises a process model.

22. The computer readable storage medium of claim 21 wherein the process model utilizes contour data from a processed wafer to simulate the contours of the environments.

23. The computer readable storage medium of claim 17 wherein the circuit features correspond to transparent regions within the mask.

24. The computer readable storage medium of claim 17 wherein the auxiliary features correspond to transparent regions within the mask.

25. The computer readable storage medium of claim 24 wherein the mask also contains attenuating regions and wherein the transparent regions associated with the auxiliary features are designed to pass radiant energy that is 180 degrees out of phase with radiant energy passing through the attenuating regions.

26. The computer readable storage medium of claim 17 wherein said method correcting step comprises an optimal proximity correction of the circuit features based on the placement of the circuit features and the auxiliary features within the environments.

27. The computer readable storage medium of claim 17 wherein multiple environments of the input design are processed in a parallel manner.

28. A computer readable storage medium containing a computer readable code for operating a computer to perform a method of eliminating side lobe printing from a phase shift mask implementing a circuit design, said method comprising the steps of:

inputting the circuit design, the design comprising circuit features to be printed from the mask;

organizing the input design into a plurality of feature environments;

simulating the environments to determine contours of the environments;

determining from the contours if there are any side lobes within the environments;

placing an auxiliary feature within the environments at a location of each determined side lobe;

correcting each environment to form a corrected design and to ensure that circuit features of the corrected design print in accordance with the input circuit design, wherein the auxiliary features eliminate side lobe printing from the mask; and verifying the corrected design to ensure that side lobes do not print from the mask by:
simulating environments of the corrected design to determine contours of the environments; and
determining from the contours if there are any side lobes within the corrected design.

29. The computer readable storage medium of claim 28 wherein said method step of simulating the environments of the corrected design is performed by determining how the environments of the corrected design would print from the mask based on a simulation model.

30. The computer readable storage medium of claim 29 wherein the simulation model comprises an optical model.

31. The computer readable storage medium of claim 30 wherein the optical model utilizes image data determined by settings of a tool used to process a wafer with the mask to simulate the contours of the environments of the corrected design.

32. The computer readable storage medium of claim 29 wherein the simulation model comprises a process model.

33. The computer readable storage medium of claim 32 wherein the process model utilizes contour data from a processed wafer to simulate the contours of the environments of the corrected design.

34. A system, comprising:

a computer readable storage medium containing program instructions for execution by a processor to eliminate side lobe printing from a phase shift mask implementing a circuit design; and a processor in communication with said computer readable storage medium, said processor executing said program instructions stored on said computer readable storage medium to:
input a circuit design, the design comprising circuit features to be printed from the mask;
organize the input design into a plurality of feature environments;
simulate the environments to determine contours of the environment;
determine whether a contour is associated with a circuit feature of the input design, and if a contour is not associated with a circuit feature, identify the contour as a determined side lobe;

place an auxiliary feature within the environments at a location of each determined side lobe; and correct each environment to form a corrected design and to ensure to that circuit features of the corrected design print in accordance with the input circuit design, wherein the auxiliary features eliminate side lobe printing from the mask.

35. The system of claim 34 wherein said processor simulates the environments by determining how the environments would print from the mask based on a simulation model.

36. The system of claim 35 wherein the simulation model comprises an optical model.

37. The system of claim 35 wherein the optical model utilizes image data determined by settings of a tool used to process a wafer with the mask to simulate the contours of the environments.

38. The system of claim 35 wherein the simulation model comprises a process model.

39. The system of claim 38 wherein the process model utilizes contour data from a processed wafer to simulate the contours of the environments.

40. The system of claim 34 wherein the circuit features correspond to transparent regions within the mask.

41. The system of claim 34 wherein the auxiliary features correspond to transparent regions within the mask.

42. The system of claim 41 wherein the mask also contains attenuating regions and wherein the transparent regions associated with the auxiliary features are designed to pass radiant energy that is 180 degrees out of phase with radiant energy passing through the attenuating regions.

43. The system of claim 34 wherein said processor corrects the environments by performing an optimal proximity correction of the circuit features based on the placement of the circuit features and the auxiliary features within the environments.

44. A system, comprising:
a computer readable storage medium containing program instructions for execution by a processor to eliminate side lobe printing from a phase shift mask implementing a circuit design; and
a processor in communication with said computer readable storage medium, said processor executing said program instructions stored on said computer readable storage medium to:
input a circuit design, the design comprising circuit features to be printed from the mask;
organize the input design into a plurality of feature environments;
simulate the environments to determine contours of the environment;
determine from the contours if there are any side lobes within the environments;
place an auxiliary feature within the environments at a location of each determined side lobe;
correct each environment to form a corrected design and to ensure to that circuit features of the corrected design print in accordance with the input circuit design, wherein the auxiliary features eliminate side lobe printing from the mask; and
verify the corrected design to ensure that side lobes do not print from the mask by:
simulating environments of the corrected design to determine contours of the environments of the corrected design; and
determining from the contours if there are any side lobes within the environments of the corrected design.

45. The system of claim 44 wherein said processor simulates the environments of the corrected design by determining how the environments of the corrected design would print from the mask based on a simulation model.

46. The system of claim 45 wherein the simulation model comprises an optical model.

47. The system of claim 46 wherein the optical model utilizes image data determined by settings of a tool used to process a wafer with the mask to simulate the contours of the environments of the corrected design.

48. The system of claim 45 wherein the simulation model comprises a process model.

49. The system of claim 48 wherein the process model utilizes contour data from a processed wafer to simulate the contours of the environments of the corrected design.

50. A system comprising:
a computer readable storage medium containing program instructions for execution by a processor to eliminate side lobe printing from a phase shift mask implementing a circuit design, said storage medium also containing a circuit design, said design comprising circuit features to be printed from the mask; and
a processor in communication with said computer readable storage medium, said processor executing said program instructions stored on said computer readable medium to:
organize the input design into a plurality of feature environments;
simulate the environments to determine contours of the environments;
determine from the contours if there are any side lobes within the environments;
place an auxiliary feature within the environments at a location of each determined side lobe, the auxiliary features corresponding to transparent regions within the mask; and
correct each environment to form a modified design and to ensure that circuit features of the modified design print in accordance with the input circuit design, wherein the auxiliary features eliminate side lobe printing from the mask and wherein the mask also contains attenuating regions and wherein the transparent regions associated with the auxiliary features are designed to pass radiant energy that is 180 degrees out of phase with radiant energy passing through the attenuating regions.

51. A computer program transmitted from a server computer to a computer system, said computer system comprising memory and a processor in communication with said memory, said memory containing the computer program, said computer program causing said processor to perform the acts of:
inputting a circuit design, the design comprising circuit features to be printed from a mask;
organizing the input design into a plurality of feature environments;
simulating the environments to determine contours of the environments;
determining from the contours if there are any side lobes within the environments by determining whether a contour is associated with a circuit feature of the input design and if a contour is not associated with a circuit feature, identifying the contour as a side lobe;
placing an auxiliary feature within the environments at a location of each determined side lobe; and
correct each environment to form a modified design and to ensure that circuit features of the modified design print in accordance with the input circuit design, wherein the auxiliary features eliminate side lobe printing from the mask.

52. A system for eliminating side lobe printing from a phase shift mask implementing a circuit design, said system comprising:

a plurality of computer systems, each computer system comprising:

a computer readable storage medium containing program instructions for execution by a processor to eliminate side lobe printing from a phase shift mask implementing a circuit design, said storage medium also containing a circuit design, said design comprising circuit features to be printed from the mask; and a processor in communication with said computer readable storage medium, said processor executing said program instructions stored on said computer readable medium to:

organize the input design into a plurality of feature environments;

simulate the environments to determine contours of the environments;

determine whether a contour is associated with a circuit feature of the input design, and if a contour is not associated with a circuit feature, identify the contour as a determined side lobe;

place an auxiliary feature within the environments at a location of each determined side lobe; and correct each environment to form a modified design and to ensure that circuit features of the modified design print in accordance with the input circuit design, wherein the auxiliary features eliminate side lobe printing from the mask, wherein each computer system processes different environments of said input design.

* * * * *

UNITED STATES PATENT AND TRADEMARK OFFICE
CERTIFICATE OF CORRECTION

PATENT NO.     : 6,401,236 B1
DATED          : June 4, 2002
INVENTOR(S)    : William J. Baggenstoss et al.

It is certified that error appears in the above-identified patent and that said Letters Patent is hereby corrected as shown below:

<u>Title page, Item [54], and Column 1, line 2,</u>
Title, "SHIFT" should read -- SHIFT MASKS --.

<u>Column 2,</u>
Line 22, "i.e., $IE^2$" should read -- i.e., $I \propto E^2$ --.

Signed and Sealed this

Fifth Day of November, 2002

*Attest:*

JAMES E. ROGAN
*Attesting Officer*           *Director of the United States Patent and Trademark Office*